United States Patent [19]

Schofield

[11] Patent Number: 4,695,886
[45] Date of Patent: Sep. 22, 1987

[54] AUTOMATIC LEVELING CIRCUIT FOR A COMPOSITE VIDEO SIGNAL

[75] Inventor: William S. Schofield, Whitesville, Ky.

[73] Assignee: Motorola, Inc., Schaumburg, Ill.

[21] Appl. No.: 785,007

[22] Filed: Oct. 7, 1985

[51] Int. Cl.$^4$ .............................................. H04N 5/53
[52] U.S. Cl. ..................................... 358/176; 358/178
[58] Field of Search ............... 358/176, 174, 178, 179, 358/188

[56] References Cited

U.S. PATENT DOCUMENTS 3,936,599  2/1976  Peil ...................................... 358/176
4,234,892  11/1980  Mochizuki ........................... 358/174

*Primary Examiner*—Tommy P. Chin

[57] ABSTRACT

An automatic leveling circuit for a composite video signal is disclosed for use in a modem in a microwave communications system for adjusting the level of the signal at the transmitter while maintaining studio quality. The circuit employs an operational amplifier as the variable gain element and employs a light emitting diode photo-conductor pair in association with the amplifier to control the amplifier gain. In particular, the horizontal synchronizing pulse from the composite video signal is separated and used with a keyed clamp to establish the video at a desired dc reference value and is applied to a sample and hold circuit where the sampled pulse amplitude is held for comparison to an operator adjusted value. The output of the comparator is then used to control the light produced by the light emitting diode in a degenerative sense to hold the video level at the operator adjusted value. The range of level adjustment is typically 6db, and differential gain and differential phase are maintained to studio standards.

5 Claims, 5 Drawing Figures

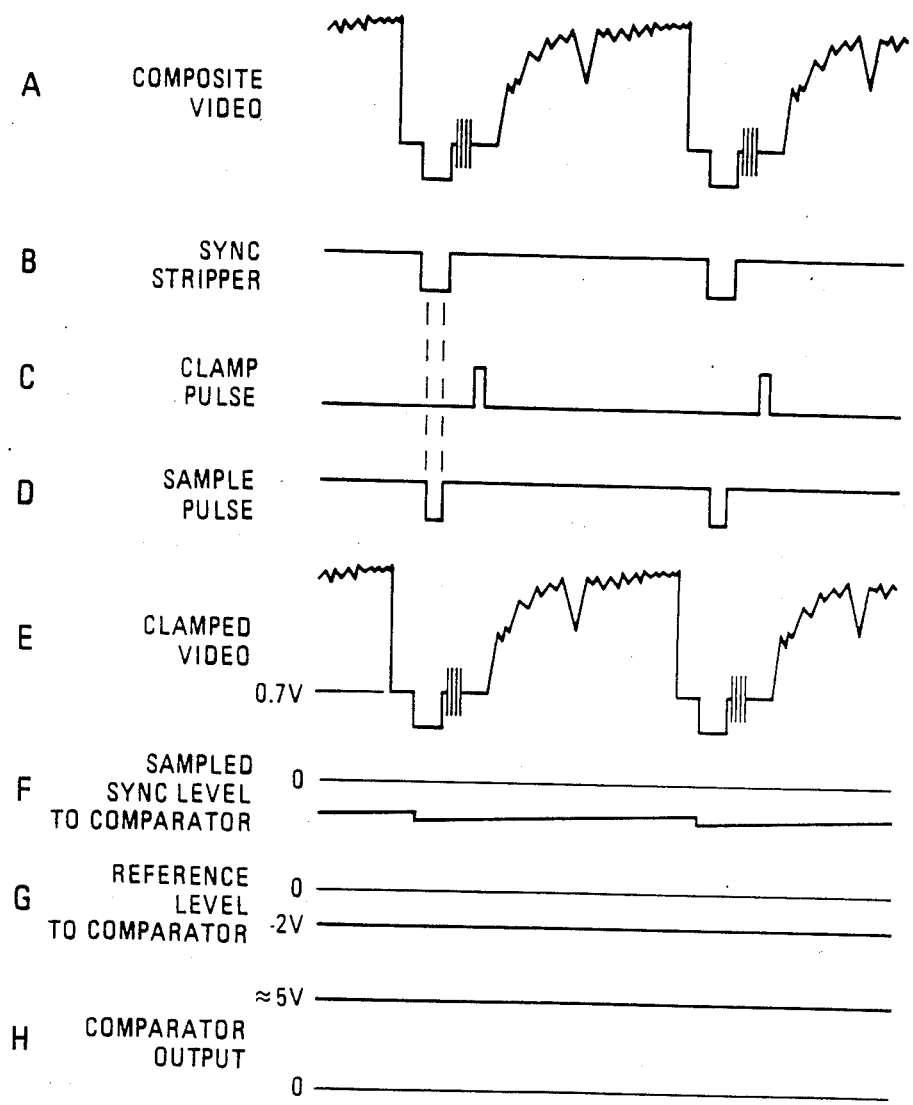

AUTOMATIC LEVELING CIRCUIT FOR A COMPOSITE VIDEO SIGNAL

BACKGROUND OF THE INVENTION

1. Field of the Invention

The present invention relates to circuits for automatically leveling a modulated signal. More particularly the invention relates to such circuits as comprise a variable gain amplifier, connected in a feedback network in which the gain of the amplifier is adjusted so that an output signal amplitude is automatically held to a desired reference value. The invention is applicable to the control of the level of a composite signal containing video, audio and synchronization information.

2. Prior Art

The present invention has practical application to a fixed point-to-point microwave communication system in which it is desired to couple a composite signal, which is locally available, to a microwave linked communication system for transmission to a remote location. In such systems it has been found desirable to provide a "modem" for standardizing the level of any locally available composite video signals before they are transmitted over the linkage. A conventional composite video signal, such as one required to meet a broadcast specification, consists of synchronization in the form of pulses for timing the fields, the frames and the lines of the video display, a color burst (for color signals), the video signal itself consisting of luminance or luminance and chrominance information (for color signals). An audio signal is also provided on a subcarrier at a frequency above the chrominance signal.

The composite video signal has a prescribed format aiding uniformity in displaying the eventual picture. A principal feature of this standardization is a prescribed relation between the amplitude of the video signal and the magnitude of the horizontal synchronization pulses. In addition, the phases within the video signal must be accurately maintained, particularly with color signals if the color rendition is to be correct. In this application, if the level of the composite signal is adjusted, the adjustment must occur without affecting the "differential gain" or the "differential phase" of the signal beyond a small tolerance. The differential gain requirement is a requirement that the gain of the amplifier (or attenuator) processing the signal be constant within a small tolerance for both low and high level signals.

Accordingly, in conventional microwave communications equipment for television signals, the modem, which is used to adjust the level of the composite video to a desired standard value, should provide adequate gain to maintain the composite video at said prescribed level over a reasonable range of levels available from the local video sources, and be able to do so without adversely affecting the quality of the composite video signal. In the application to which the present invention is addressed, the amplifier must have an adequate range of gain to bring the signals over this range of levels to the desired value, while at the same time meeting the differential gain and differential phase specifications required to maintain video signal quality.

In television equipment, the conventional automatic gain control circuit involves a variable gain amplifier, a feedback loop in which the horizontal synchronizing pulse is separated at the amplifier output, and compared to a standard level, to provide a control voltage used to control the gain of the amplifier. The present invention follows this general approach.

Generally, meeting the specifications for maintaining studio quality in known circuits of this application poses a significant technical challenge, particularly in a simple and low cost manner. The critical element, which poses the problem, is the amplifier in which the gain is varied.

SUMMARY OF THE INVENTION

Accordingly, it is an object of the present invention to provide an improved automatic leveling circuit for a composite video signal.

It is another object of the invention to provide an automatic leveling circuit for a composite video signal in which differential gain and differential phase performance is improved.

It is still another object of the invention to provide in an automatic leveling circuit for a composite video signal, a novel variable gain amplifier facilitating improved differential gain and differential phase performance.

These and other objects of the invention are achieved in an automatic leveling circuit for a composite video signal in which the video portion of the signal bears a standard relationship to the level of the horizontal synchronizing pulses.

The leveling circuit comprises a wideband variable gain amplifier comprising an operational amplifier having a non-inverting and an inverting terminal and an output terminal, the gain of which is determined by the value of a resistance ($R_F$) coupled between the output terminal and the inverting input terminal and the resistance ($R_G$) coupled between the inverting terminal and ground, the resistance ($R_G$) being formed at least in part by a photo-sensitive resistor.

The leveling circuit further comprises means for developing an electrical quantity proportional to the amplitude of the synchronizing pulse in the composite video signal at the amplifier output, a comparator to which an adjustable reference is coupled for producing an output dependent upon the difference between the amplitude of the synchronization pulse and the adjustable reference, and a light emitting diode whose energization is controlled by the output of the comparator. The light emitting diode, while electrically isolated, is optically coupled to the photo-sensitive resistive element to vary the gain of the amplifier by varying a portion of ($R_G$) in a sense to maintain the level of the video signal at the output of the amplifier in substantial equality with the adjustable reference. The circuit maintains the video signal at the desired level while maintaining accurate differential phase and differential gain.

In accordance with one feature of the invention, the electrical quantity proportional to the synchronizing pulse amplitude is obtained by clamping the blanking level of the composite video signal to a reference value and sampling the synchronizing pulse available in the clamped composite video signal.

The sampling is performed by a sample and hold circuit, which produces a sustained voltage equal to the amplitude of the synchronizing pulse sample.

In accordance with a further feature of the invention, the instant for keying the clamp and the instant for sampling the synchronizing pulse are derived from the synchronizing pulse of the composite video signal at the amplifier output. The synchronizing pulse is first separated from the composite video signal by thresholding. Next, a first delayed and narrowed pulse, for keying the clamping means, and a second narrowed keying pulse, for timing the sample so that it occurs within the horizontal pulse, are produced. The means for obtaining the keying pulse and the sampling pulses are one-shot multivibrators.

BRIEF DESCRIPTION OF THE DRAWINGS

The novel and distinctive features of the invention are set forth in the claims of the present application. The invention itself, however, together with further objects and advantages thereof, may best be understood by reference to the following description and accompanying drawings in which:

FIG. 3 illustrates the waveforms occurring at the interconnections between blocks, as an aid to explaining the operation of the amplification circuit.

DESCRIPTION OF THE PREFERRED EMBODIMENT

Figure 1:
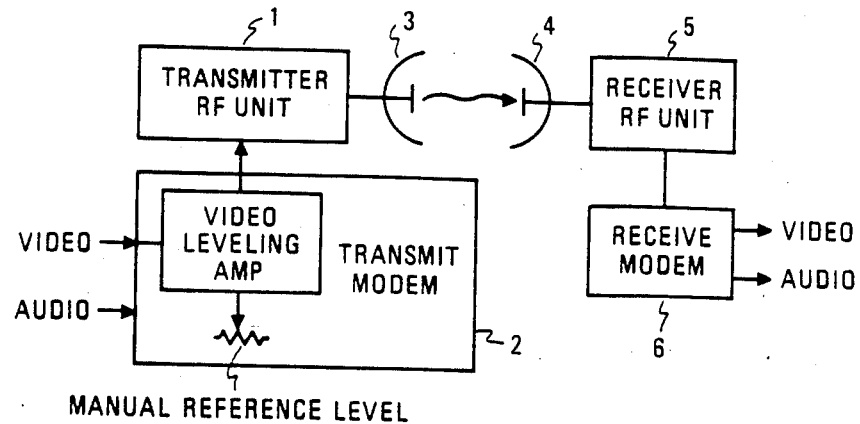
FIG. 1 is an illustration of portions of a microwave communications link for video information in which the automatic leveling video amplification circuit of the invention finds application.

FIG. 1 illustrates the portions of a microwave communications link for video information in which the automatic leveling amplifier circuit finds application. A transmitter consisting of a transmitter radio frequency unit 1, a modem 2, and a microwave transmitting antenna 3 are located at the transmitting site. As suggested by the block diagram, the local signal containing video and audio components is coupled to the modem 2 which may be seen to contain a video leveling amplifier circuit, which by means of a manual gain setting (symbolized by a tapped resistance) produces a leveled video signal for coupling to the modulating input of the transmitter RF unit.

The transmitter RF unit 1, the details of which are not illustrated, contains a direct modulated microwave oscillator and produces at its output a signal in which the video and audio have been modulated upon a high frequency carrier, typically in the 23 GigaHertz communications band.

The transmitted signal, radiated from the transmitter by means of a directional antenna 3, is received at a remote location on a comparable receiving antenna 4, whose output is coupled to a receiver RF unit 5. The output of the unit 5, which is at a reduced frequency, typically 230 mHz, is coupled to a receive modem 6. At the output of the receive modem 6, the individual video and audio signals are extracted for local use.

The above explanation describes a simplex unit in which only a single transmitter is present at one location and a single receiver present at the other location. In the conventional application the units at each location can be a transmitter and a receiver, i.e. a "transceiver" sharing a common antenna.

Figure 2:
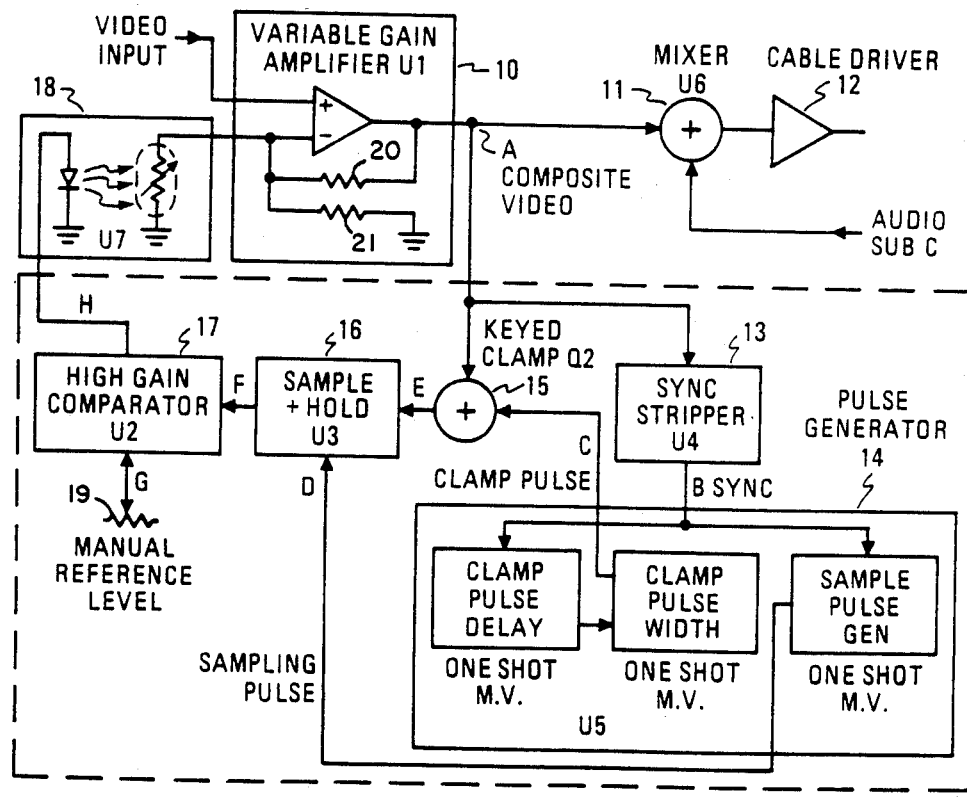
FIG. 2 is a block diagram of the automatic leveling video amplification circuit in which the blocks correspond to the principal functions performed within the circuit.

The video leveling amplifier circuit, whose presence is indicated in the modem in FIG. 1, is illustrated in functional block detail in FIG. 2. FIG. 3 illustrates the signals as they progress between blocks through the circuit. The automatic leveling circuit consists of the blocks 10-18.

The elements 10, 11 and 12, consisting of the variable gain amplifier 10, the mixer 11 and the cable driver 12, are interconnected in the order recited between the local video input and the transmitter RF unit. In particular the local video signal is coupled to the input of the variable gain amplifier 10. The amplifier output is coupled to the mixer 11, to which the local video signal and the audio subcarrier are applied before to coupling to the cable driver 12 and which provides the necessary gain to couple the composite signal (now containing video and audio) to the transmitter RF unit, which may be at some distance from the modem.

The automatic leveling circuit comprises the elements 10, 13, 14, 15, 16, 17 and 18, the element 10 being the variable gain amplifier per se and the elements 13-18 providing the feedback loop and means for standardizing the composite signal against the DC reference voltage.

The composite video signal, which is coupled to the mixer 11, as just described, is also coupled to the successive elements in the feedback loop. The composite video signal is illustrated by the waveform A in FIG. 3. It includes the video information, a horizontal synchronizing pulse as illustrated, and also includes the vertical and interlace timing data (not illustrated), and the color burst. Not present are the audio signals which are added in the path to the mixer 11.

The composite video signal in the feedback path is AC coupled to the sync stripper 13 and to one input of the keyed clamp 15. In the sync stripper, in which only timing information is sought, the composite video signal is clamped to ground by a diode, allowing signals below the diode threshold to be transmitted. This strips off the video information and the color burst, leaving only the synchronizing pulses. The output of the sync stripper is illustrated by the waveform B, which consists of a pulse whose timing is coincident with the original horizontal sync pulse.

The composite video signal is also coupled to the signal input of the keyed clamp 15, where it is clamped during a period set by the clamp pulse (waveform C) generated in the pulse generator 14.

The pulse generator 14, as illustrated in FIG. 2, receives the stripped sync pulse and generates two output pulses: a clamp pulse (waveform C), used to clamp the composite video blanking level at a particular time defined by the pulse itself, and a sample pulse (waveform D), which is used to time the sample of the sync pulse taken from the video signal after clamping.

The clamp pulse (waveform C) is generated in two one shot multivibrators, which delay and successively narrow the sync pulse (waveform B) until it is coincident with the video blanking voltage immediately after the color burst. The clamp pulse is then coupled to the keyed clamp 15, where the composite video signal and, in particular, the composite video blanking level are clamped to a standard value (i.e. 0.7 volts) established at the clamp. The clamped video waveform produced at 15 is illustrated by the E waveform in FIG. 3, with the level +0.7 volts being indicated as equal to the level of the composite video blanking. The upper extremity of the horizontal sync pulse in the composite video signal is set by these measures to the 0.7 volts reference value.

The second output of the pulse generator 14, the sample pulse (waveform D), is both delayed from and made narrower than the sync pulse (waveform B) and is set to occur within the time limits of the sync pulse. The sample pulse is generated from the sync pulse by the sample pulse generator, a single one shot multivibrator.

The next element in the feedback path is the sample and hold circuit 16 to which the clamped video (waveform E) is applied and sampled during the sample pulse (waveform D). The output of the sample and hold circuit is a sample of the floor of the sync pulse derived from the clamped video.

The output of the sample and hold network 16 is a sample of the horizontal synchronizing pulse having a negative value, which decays slowly with time. The output is an accurate measure of the level of the video signal. The sampled horizontal sync pulse is next coupled to the non-inverting input of the comparator 17. The voltage coupled to the other input of the comparator is controlled by a variable resistance 19 which determines the video output level. The input voltages into the comparator 17 are shown by the waveforms F and G. They comprise the output of the sample and hold, which is approximately −2 volts (dropping slightly) illustrated by waveform F, and the fixed DC voltage available from variable resistance 19 which varies from −1 to −2 volts, dependent on the desired gain setting.

The output of the comparator 17, which is a linear comparator, increases inversely as the measured signal amplitude decreases with respect to the adjustable reference. This output is coupled to the electrical input of the optical coupler 18. The optical coupler generates light, increasing with increasing energization, which falls upon an optically sensitive variable resistance i.e. photo-resistor. The optically sensitive variable resistance is connected in shunt between the inverting input terminal of variable gain amplifier 10 and ground. The variable gain features of the invention will now be treated in detail.

The variable gain amplifier achieves its variable gain properties by adjustment of two external resistances associated with it. The amplifier itself is an operational amplifier of high gain and high band width having a feedback resistor $R_F$ (20) coupled between its output and its inverting input. The total resistance $R_G$ (21) appearing between its inverting terminal and ground is the other external resistance. The gain of the amplifier is equal to the ratio of $(R_G+R_F)/R_G$. Any change in the value of $R_F$ (which does not occur) or in the value of $R_G$ (which does occur) will affect the gain of the amplifier.

As illustrated in FIG. 2, $R_G$ 21 is made up of a resistor external to the amplifer and the resistance of the photo-resistor, which is electrically in parallel.

Should the comparator indicate that the sampled sync pulse has exceeded the threshold set by variable resistance 19 (i.e. less negative), then the optical coupler will generate more light, the resistance of photo-resistor will fall, and the gain of the amplifier, by this changing of the relationship of $R_F$ to $R_G$, will increase to degeneratively correct the level of the output signal to the reference value.

The embodiment just described has been found to maintain the differential gain and the differential phase within the customary limits required for studio quality television transmission, over a 2 to 1 range of level adjustment. This is ordinarily adequate for customary modem flexibility.

Figure 4A:
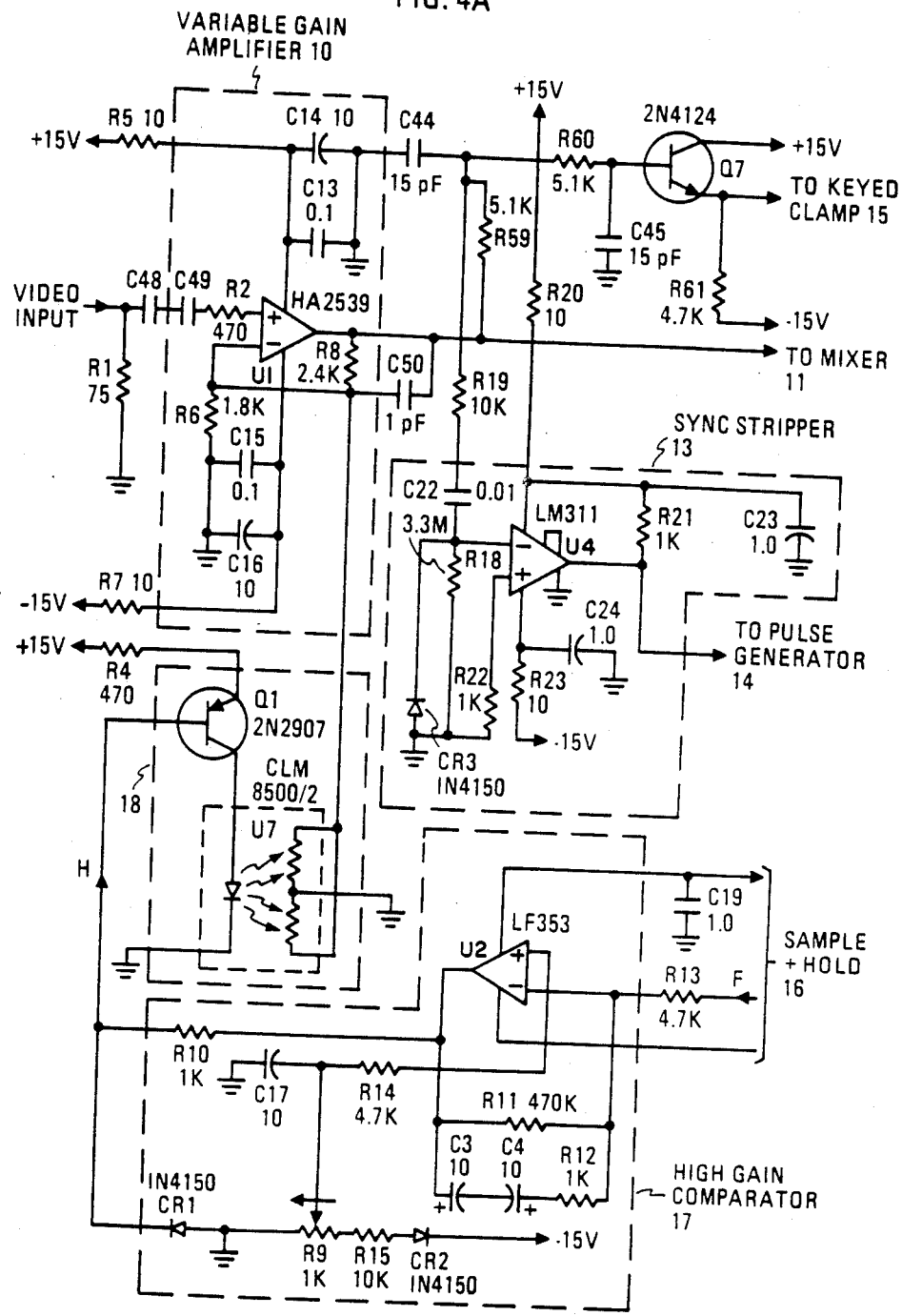
FIGS. 4A and 4B illustrate the component selection and principal features of the electrical design of a practical embodiment of the invention.
Figure 4B:
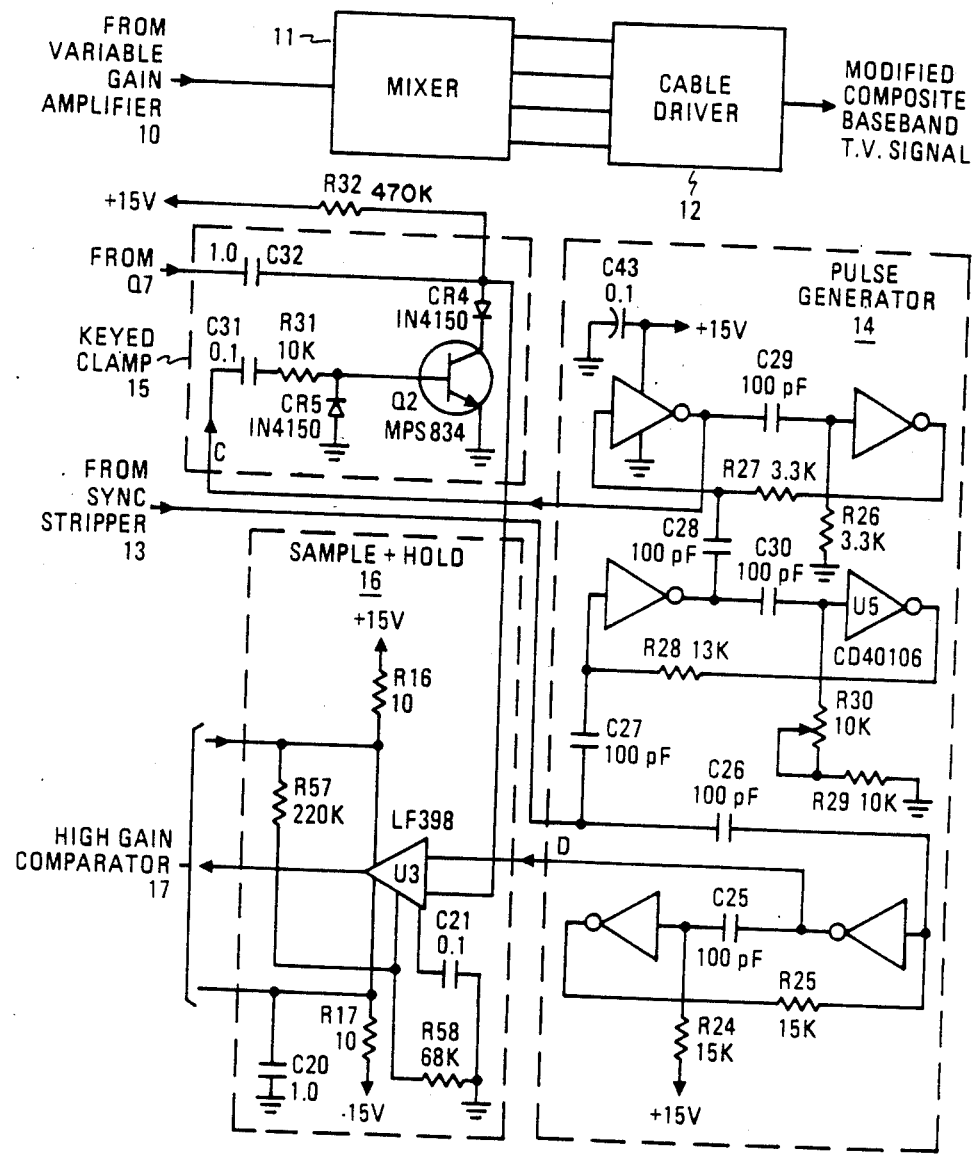

The actual circuit of the FIG. 2 embodiment is illustrated in FIGS. 4A and 4B. The component values, model numbers and principal operating potentials are provided for ease in understanding. The components have been grouped into blocks with dotted outlines approximately corresponding to the blocks of FIG. 2.

The variable gain amplifier indicated by the symbol U1 in the variable gain amplifier block 10 is a Harris HA2539 "Very High Slew Rate Wideband Operational Amplifier" available in integrated circuit form.

The optical coupler 18 is an LED (Light Emitting Diode) photo-conductor isolator Clairex Electronics type CLM 8500/2 connected in the emitter circuit of a transistor type 2N2907.

What is claimed is:

1. A circuit for automatically leveling to a desired amplitude level a composite video signal having horizontal synchronizing pulses and a video portion whose amplitude level bears a standard relationship to the amplitude level of the horizontal synchronizing pulses, comprising:
    A. means for supplying the composite video signal at an amplitude level typically differing from the desired amplitude level,
    B. a wideband variable gain amplifier, for producing a composite video output signal, comprising an operational amplifier having a non-inverting terminal coupled to the composite video signal, an inverting terminal, and an output terminal and having a gain determined by the relationship of a first resistance ($R_f$), coupled between said output terminal and said inverting input terminal, and a second resistance ($R_g$) coupled between said inverting terminal and ground, said second resistance ($R_g$) being formed at least in part by a photo-sensitive resistor,
    C. means coupled to the output terminal of said operational amplifier for developing an electrical quantity proportional to the amplitude level of the horizontal synchronizing pulses in the composite video output signal, and
    D. a comparator, having first and second inputs, an adjustable reference amplitude level applied to the first input, and said electrical quantity proportional to the amplitude level of the horizontal synchronizing pulses applied to the second input, for producing an output dependent upon the difference between the amplitude levels of said first and second inputs, and
    E. a light emitting diode, whose energization is controlled by the output of said comparator, optically coupled to said photo-sensitive resistor to vary the gain of the operational amplifier in a sense to maintain the amplitude level of the composite video output signal in substantial equality with said adjustable reference amplitude level, while maintaining accurate differential phase and differential gain.

2. The automatic leveling circuit set forth in claim 1, wherein said composite video signal may have color bursts and has a blanking level that represents one extremity of said horizontal synchronizing pulses and wherein said means for developing an electrical quantity proportional to the amplitude level of the horizontal synchronizing pulses comprises:
    (1) keyed clamping means coupled to the output terminal of said operational amplifier, for clamping said composite video output signal during the blanking level to an amplitude reference level to produce a clamped composite video signal and
    (2) means for sampling said clamped composite video signal during the horizontal synchronizing pulses to produce potential difference samples proportional to the amplitude level of said horizontal synchronizing pulses.

3. The automatic leveling circuit set forth in claim 2 wherein said means for sampling said clamped composite video signal is a sample and hold circuit for producing a sustained voltage level equal to the amplitude level of said potential difference samples.

4. The automatic leveling circuit set forth in claim 3 further comprising:
  (i) threshold means coupled to said output terminal of said operational amplifier for stripping said horizontal synchronizing pulses from said composite video output signal,
  (ii) first means, coupled to said threshold means, for deriving narrowed and delayed pulses coincident in time with the blanking level of said composite video output signal but avoiding the color bursts, if present, for timing said keyed clamping means and
  (iii) second means, coupled to said threshold means, for deriving narrowed and delayed pulses lying within said horizontal synchronizing pulses for timing said sample and hold circuit.

5. The automatic leveling circuit set forth in claim 4 wherein said first means for deriving narrowed and delayed pulses comprises two successive one-shot multivibrators and said second means for deriving narrowed and delayed pulses comprises a single one-shot multivibrator.

* * * * *